US006417681B1

(12) United States Patent
Co et al.

(10) Patent No.: US 6,417,681 B1
(45) Date of Patent: Jul. 9, 2002

(54) ENHANCED PROBE DEVICE FOR USE IN HIGH DENSITY APPLICATIONS

(75) Inventors: Gricell Co, Austin; Gary Roy Emerson, Elgin, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/078,969

(22) Filed: May 14, 1998

(51) Int. Cl.[7] ............................................. G01R 31/02
(52) U.S. Cl. ...................................... 324/754; 324/761
(58) Field of Search ............................. 324/72.5, 149, 324/754, 755, 757, 758, 761, 765; 359/802, 803, 805, 896

(56) References Cited

U.S. PATENT DOCUMENTS

| | | | | |
|---|---|---|---|---|
| 2,732,761 A | * | 1/1956 | Bender et al. ............. 359/810 |
| 3,011,258 A | * | 12/1961 | Kotchan ................... 30/367 |
| RE26,732 E | * | 12/1969 | Forcier ................... 346/33 F |
| 3,655,960 A | * | 4/1972 | Andree .................... 362/119 |
| 4,137,561 A | * | 1/1979 | Andree .................... 362/119 |
| 5,052,802 A | * | 10/1991 | Hayes et al. ............ 356/237.1 |
| 5,105,148 A | * | 4/1992 | Lee ........................ 324/754 |

* cited by examiner

Primary Examiner—Michael J. Sherry
Assistant Examiner—Russell M. Kobert
(74) Attorney, Agent, or Firm—Thomas E. Tyson; Edmond A. DeFrank

(57) ABSTRACT

An enhanced probe apparatus is provided for facilitating pin contact on a multi-pin integrated circuit or other high density connector-pin environment. The probe includes, in one exemplary embodiment, a magnification lens and an LED lamp which are both are mounted in various arrangements to an oscilloscope probe device. Both the lens and the LED are adjustable independently and each is movable in a plurality of directions to optimize the magnification and illumination of a pin contact area on one edge of an integrated circuit chip in order to facilitate pin identification and probe-to-pin contact for signal acquisition.

8 Claims, 1 Drawing Sheet

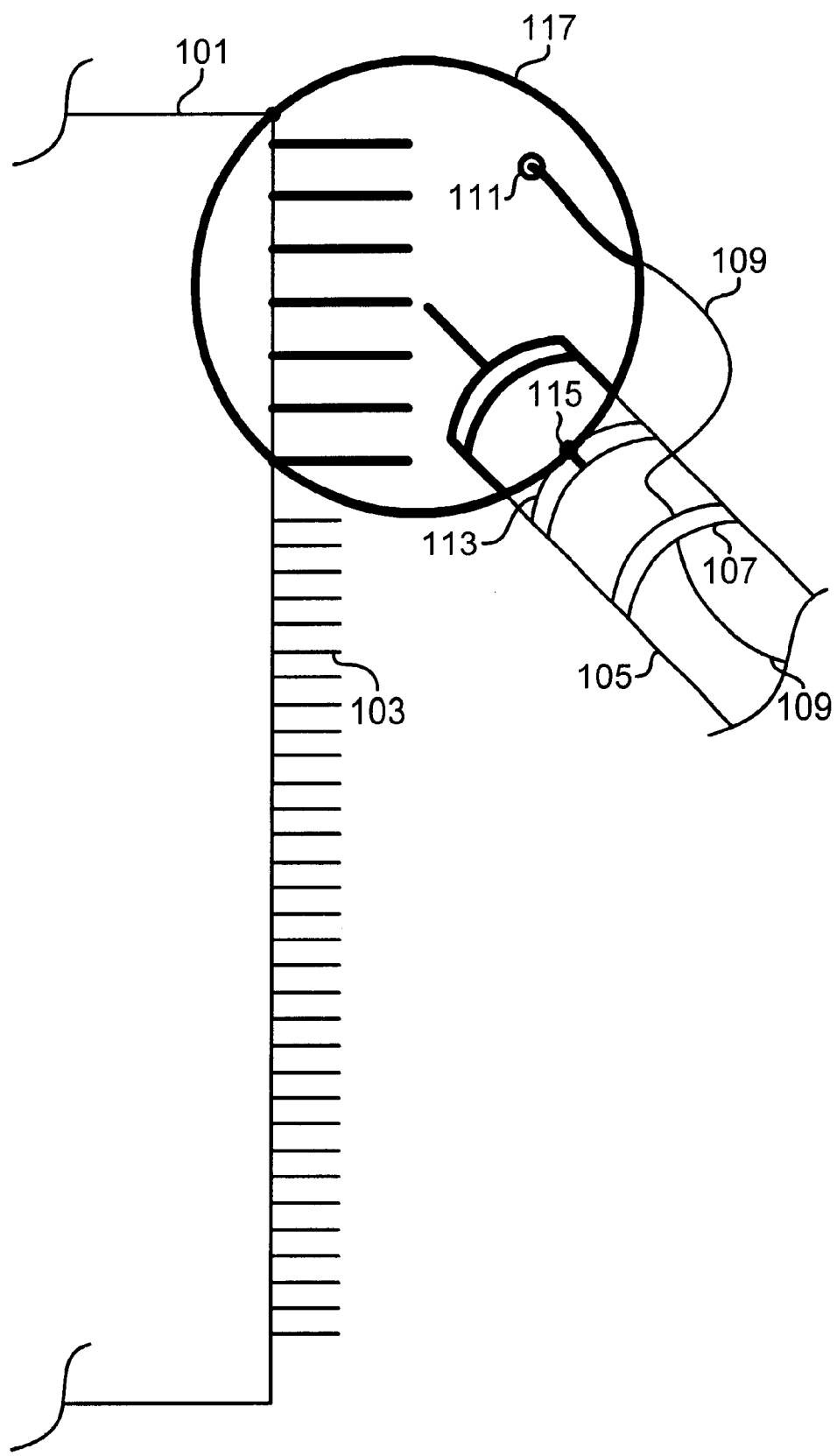

ENHANCED PROBE DEVICE FOR USE IN HIGH DENSITY APPLICATIONS

FIELD OF THE INVENTION

The present invention relates generally to test equipment and more particularly to an improved electronic probe device for use in electronic signal acquisition and measuring.

BACKGROUND OF THE INVENTION

With advances in the state of the art with regard to semiconductor and electronic device manufacturing techniques, integrated circuits (ICs) or electronic "chips" have become smaller and smaller while, at the same time, including more circuitry to which electrical connections must be made. As ICs move to higher density pin packages to accommodate more functions, the physical pitch or distance between connection points or pins along the edges of the chips decreases. This decreased pitch, in turn, has made signal waveform capture with an oscilloscope probe for design and/or testing of the chip increasingly difficult. In many cases, an individual must count the number of pins from an edge or other reference point on the chip in order to position the probe to make contact with the appropriate pin connector on the chip. This is an exceedingly difficult task because of the very small dimensions involved and the available light conditions relative to the spacing of the pins. The process of signal acquisition therefore frequently produces erroneous results because a test probe did not make contact with the proper pin.

The high impedance probes available today offer very fine tips designed to probe the high-pin small-pitch pin parts. The problem, however, is that there are so many pins that if the pin to be probed is one in the middle of 50 pins or more along an edge of a chip, it becomes difficult to count the correct pin since the naked eye cannot easily distinguish the individual pins from each other within such a crowded environment. In many cases, a tester loses track of the pin count and must start over to insure the proper pin count to contact the correct chip pin in order to acquire the desired signal being examined on an oscilloscope. Moreover, with such small pin pitch, a probe is more likely to be inadvertently placed between pins instead of directly on only a target pin, and contact with more than one pin can result in a system power-down or permanent IC damage.

Accordingly, there is a need for an enhanced probe apparatus which is effective to enable and facilitate the placement by a human tester of the probe on a desired specific pin within an array of pin connectors from an integrated circuit or other high density pin environment.

SUMMARY OF THE INVENTION

An enhanced probe apparatus is provided for facilitating pin contact on a multi-pin integrated circuit or other high density connector-pin environment. The probe includes vision-enhancing devices coupled thereto. In one exemplary embodiment, a magnification device and an illuminating device are mounted in a selectively adjustable manner to optimize the magnification and illumination of a pin contact area on one edge of an integrated circuit chip in order to facilitate pin identification and probe-to-pin contact for signal acquisition.

BRIEF DESCRIPTION OF THE DRAWINGS

A better understanding of the present invention can be obtained when the following detailed description of a preferred embodiment is considered in conjunction with the following drawing, in which:

The FIGURE is a simplified schematic illustration of an enhanced oscilloscope probe device implemented in accordance with the present invention.

DETAILED DESCRIPTION

With reference to The FIGURE, there is shown an edge section of an integrated circuit device or chip 101. The edge section illustrated includes a plurality of pin connectors such as pin 103, which are provided for interfacing with the circuitry within the IC. In testing such ICs, for example with an oscilloscope, to determine if a specific signal is present on a designated pin when the IC is powered-on, a probe device is used to make electrical contact with the specific pin in question.

A probe body 105 is shown in cut-away view so as not to obfuscate the operational features of the exemplary embodiment. The probe includes a contact tip or point 119 for making contact with selected pins on an integrated circuit. As illustrated, the probe body 105 includes a retainer or positioning clamp 107 which is used to provide an anchor point for and retain an electrical cable 109. The cable 109 in the example is comprised of three electrical conductors, one of which is a ground wire. The other two wires are used to connect power to an illumination device 111 such as a light emitting diode or LED. One such lighting device used in one exemplary embodiment was a "T-1 ¾ Super Ultra-Bright Yellow LED Lamp, Hewlett Packard HLMP 8305 or 8309". These LEDs are designed to provide high intensity light with narrow viewing angles. The cable 109 is extended back along the probe body 105 to be connected to a power source. In general, such electronic probes contain appropriate voltage levels within the probe device to power the LED device 111.

Also shown in The FIGURE, is another connector band device 113 such as an adjustable clamp, to secure a magnification device 117 such as a magnifying lens, relative to the probe body 105. In the example, the magnifying device 117 includes a ring-frame which may be secured to another ring-frame 115 which is, in turn, secured to the connector band 113. The illustrated arrangement may be altered and may also be implemented in any mechanical arrangement in order to accomplish the desired functions of selective positioning of the magnification device 117 to enable and enhance a user's view of an IC pin arrangement. The exemplary embodiment will allow the connector band 113 to selectively slide along the probe body 105, and also to allow the magnification device 117 to be rotated around the connector band 113, and also to allow the angle of the magnification device 117 to be adjusted relative to the probe body 105 and the probe tip 119, which in turn, will allow the user's viewing angle to be selectively adjusted. The connector band 113 may also serve the function of the positioning clamp 107 in which case the LED may move in constant relative position with the lens device 117 when the band 113 is moved. The several adjustments enabled by the exemplary embodiment allow a user to view different edges on a chip from a number of different angles to facilitate the task of pin identification and probe contact.

The cable 109 is a flexible but relatively stiff construction which may be acquired off-the-shelf or by wrapping the enclosed wires with a flexible but stiff wrapping tape. The flexibility allows selective positioning of the LED 111 relative to a viewing area while the stiffness will maintain the position of the LED 111 while manipulating the probe body 105 for the desired contacting between the probe tip 119 and a target IC interface pin. The design of the illumination device, including the wire 109 and the LED 111, also allows the selective positioning of the illumination device in combination with, and relative to, the magnification device 117, in any of the various relative positions in which the magnification device 117 may be selectively placed.

The apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A probe device for making electrical contact with an electrical connection pin of an electrical device, said probe device comprising:

a probe body;

a probe contact point connected to said probe body, said probe body being selectively movable by an operator to position said probe contact point for selectively making said electrical contact;

a magnification device connected to said probe body, said magnification device being selectively adjustable for magnifying a viewing area, said viewing area selectively including said probe contact point; and an illumination device connected to said probe body for illuminating said viewing area from one of a plurality of positions relative to said probe contact point and being selectively adjustable in all directions independently of said magnification device.

2. The probe device as set forth in claim 1 wherein said illumination device includes a light emitting diode device.

3. The probe device as set forth in claim 1 wherein said magnification device is selectively adjustable to rotate to one of a plurality of positions around a central axis of said probe body.

4. The probe device as set forth in claim 1 wherein said magnification device includes a lens device, said lens device being connected to said probe body at a connection point, said lens device being arranged to define a viewing axis between an operator and said viewing area, said lens device being selectively adjustable for rotational movement about said connection point to vary said viewing axis.

5. The probe device as set forth in claim 4 and further including movable mounting means containing said connection point, said movable mounting means being arranged to enable said connection point to be selectively movable in a direction parallel to said central axis of said probe device.

6. The probe device as set forth in claim 4 and further including:

an illumination device connected to said probe body, said illumination device being selectively adjustable for illuminating said viewing area.

7. The probe device as set forth in claim 6 wherein said illumination device is selectively adjustable for illuminating said viewing area from one of a plurality of positions relative to said probe contact point.

8. The probe device as set forth in claim 7 wherein said illumination device is adjustably movable in all directions independently of said magnification device.

* * * * *